(12) United States Patent
Nandy et al.

(10) Patent No.: US 8,502,603 B2
(45) Date of Patent: Aug. 6, 2013

(54) OUTPUT COMMON MODE VOLTAGE STABILIZER OVER LARGE COMMON MODE INPUT RANGE IN A HIGH SPEED DIFFERENTIAL AMPLIFIER

(71) Applicant: STMicroelectronics International N.V., Amsterdam (NL)

(72) Inventors: Tapas Nandy, Delhi (IN); Surendra Kumar, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 13/735,114

(22) Filed: Jan. 7, 2013

(65) Prior Publication Data

US 2013/0127537 A1 May 23, 2013

Related U.S. Application Data

(63) Continuation of application No. 12/622,167, filed on Nov. 19, 2009, now Pat. No. 8,350,622.

(51) Int. Cl.
*H03F 3/45* (2006.01)

(52) U.S. Cl.
USPC .......................................... 330/253; 330/261

(58) Field of Classification Search
USPC ................................... 330/253, 261, 257, 258
See application file for complete search history.

(56) References Cited

U.S. PATENT DOCUMENTS

| | | | | |
|---|---|---|---|---|
| 5,212,455 | A | * | 5/1993 | Pernici et al. ................. 330/253 |
| 5,801,524 | A | | 9/1998 | Boerstler |
| 5,844,442 | A | | 12/1998 | Brehmer |
| 6,747,514 | B1 | * | 6/2004 | Aude ............................ 330/253 |
| 7,091,783 | B2 | * | 8/2006 | Bailey et al. ................. 330/252 |
| 7,532,072 | B1 | | 5/2009 | Tavakoli Dastjerdi et al. |
| 7,629,848 | B2 | * | 12/2009 | Wu ............................... 330/258 |
| 7,737,782 | B1 | | 6/2010 | Sudou |
| 7,884,671 | B2 | | 2/2011 | Chung |

* cited by examiner

*Primary Examiner* — Henry Choe
(74) *Attorney, Agent, or Firm* — Gardere Wynne Sewell LLP

(57) ABSTRACT

A circuit includes a differential amplifier having a folded cascode architecture with a pair of cascode transistors. A sensing circuit senses a common mode input voltage of a differential input signal applied to the differential amplifier. A bias generator circuit generates a bias voltage for application to the pair of cascode transistors in the folded cascode architecture. The bias generator circuit is connected to an output of the sensing circuit such that the generated bias voltage has a value which is dependent on the sensed common mode input voltage. This dependence stabilizes a common mode output voltage from the differential amplifier in response to changes in the common mode input voltage.

20 Claims, 3 Drawing Sheets

OUTPUT COMMON MODE VOLTAGE STABILIZER OVER LARGE COMMON MODE INPUT RANGE IN A HIGH SPEED DIFFERENTIAL AMPLIFIER

CROSS REFERENCE TO RELATED APPLICATION

The present application is a continuation of United States Application for Patent Ser. No. 12/622,167 filed Nov. 19, 2009, the disclosure of which is incorporated by reference.

BACKGROUND OF THE INVENTION

1. Technical Field of the Invention

The present invention relates to differential amplifier circuits and, more specifically, to stabilizing the output common mode voltage of such differential amplifier circuits over a large common mode input range.

2. Description of Related Art

Reference is now made to FIG. 1 which illustrates a schematic diagram of a prior art differential amplifier 10 with large bandwidth and fixed controlled gain. Such an amplifier is often used as a pre-amplifier. The differential amplifier 10 includes an input stage comprising a pair of PMOS input transistors 12 and 14. The gate of transistor 12 receives an input signal INP while the gate of transistor 14 receives an input signal INN. The input signals INP and INN form a differential input signal. The sources of input transistors 12 and 14 are connected together at node 16. The input stage further includes a PMOS tail current source transistor 18 for the differential input transistors 12 and 14 that is connected between a positive supply node (VDD) and node 16. A bias voltage Vbias is applied to the gate of transistor 18. The source of transistor 18 is coupled to receive power from the positive supply node (VDD).

The differential amplifier 10 further includes a pair of NMOS transistors 20 and 22 (cascode devices). The gates of transistors 20 and 22 are connected together and further receive a bias voltage VCN. The source of transistor 20 is connected to the drain of transistor 12 at node 24, and the source of transistor 22 is connected to the drain of transistor 14 at node 26. This forms the well recognized folded cascode amplifier architecture. A first resistance (for example, a resistor) 28 is connected between node 24 and a ground node (GND), while a second resistance (for example, a resistor) 30 is connected between node 26 and the ground node (GND).

A first output signal OUTN for the amplifier 10 is taken at the drain of transistor 20 (node 32). A second output signal OUTP for the amplifier 10 is taken at the drain of transistor 22 (node 34). The output signals OUTN and OUTP form a differential output signal. A third resistance (for example, a resistor) 36 is connected between node 32 and the positive supply node (VDD), while a fourth resistance (for example, a resistor) 38 is connected between node 34 and the positive supply node (VDD).

Under balanced conditions, IS=(IT/2)+IL; where IS is the current in resistance 28 or 30, and IL is the load current in resistance 36 or 38. The common mode voltage at the output is Vcm=VDD−R28*IL=VDD−(2*IS−IT); where R28 is the value of the resistance 28. As the common mode input voltage (V(INP)+V(INN))/2 increases towards VDD, the tail current IT decreases due to the limited output impedance of the PMOS tail current transistor 18. This decrease is even greater in instances of a low voltage VDD where it is not possible to cascode on transistor 18. As the tail current IT decreases, the common mode voltage at the output (Vcm) decreases in the manner generally shown with line 100 of FIG. 4 (this is caused because the load current IL correspondingly increases due to the fact that VCN is a constant bias to the gate, and thus the voltage at nodes 24 and 26 decreases, resulting in an increasing gate-source voltage for the cascode transistors 20 and 22). The relationship between common mode voltage at the input and common mode voltage at the output exhibits a very large slope (for example, a 20% change has been observed in simulating the operation of FIG. 1 for a given process technology). This decrease in common mode voltage at the output as common mode voltage at the input increases can cause trouble for following circuits (for example, latches in high speed links) coupled to the output nodes 32 and 34. A need exists to keep the output common mode voltage as fixed or steady (i.e., stabilized) as possible responsive to changes in the input common mode voltage.

It will be noted that the foregoing concern exists as well when the differential amplifier instead uses an NMOS input stage (as opposed to the PMOS input stage of FIG. 1). The problem also exists for combined PMOS and NMOS input stages configured for widening the common mode input range.

Reference is now made to FIG. 2 which illustrates a schematic diagram of a prior art differential amplifier 50. The amplifier 50 has a circuit configuration similar to that of amplifier 10 in FIG. 1. Thus, like reference numbers are used for like components and connections. To address the issues noted above, the amplifier 50 includes a resistive divider circuit 52 for sensing the common mode output voltage. The resistive divider circuit 52 is connected across the output nodes 32 and 34. The circuit 52 could alternatively be implemented using gate isolated structures as known in the art. This circuit 52 undesirably adds a current load (resistive or capacitive) onto the output of the amplifier 50. The voltage at the tap node 54 is compared by a first comparison amplifier 56 to a fixed common mode reference voltage (VCMref). The output of the first comparison amplifier 56 is applied to the gate of an added tail current source transistor 58 connected in parallel with the tail current source transistor 18. The feedback provided by amplifier 56 and transistor 58 alters the tail current IL of the amplifier 50 responsive to the sensed common mode output voltage so as to stabilize the common mode voltage level. However, both transistor 18 and transistor 58 suffer from limited output impedance so that the tail current source may enter the linear operating region due to operation of the negative feedback loop resulting in loss of loop control as the input common mode voltage increases. Moreover, the loading of the output nodes 32 and 34 (either resistively as shown with circuit 52, or capacitively in the case of the use of gate isolated structures) is not preferred when amplifier 50 must operate as a high speed amplifier.

An alternative implementation, also shown in FIG. 2, uses a second comparison amplifier 60 to compare the voltage at the tap node 54 to the fixed common mode reference voltage (VCMref). The output of the second comparison amplifier 60 is applied as the bias voltage VCN to the connected gates of the pair of NMOS transistors 20 and 22. While this solution does not suffer from the potential problem of losing loop control, it does share the concern regarding output loading due to the sensing of the output common mode voltage level with circuit 52.

U.S. Pat. No. 7,532,072 (the disclosure of which is hereby incorporated by reference) provides another solution, but the disclosed solution, like the circuit of FIG. 2, suffers from the same concerns over losing loop control and output loading.

A need exists in the art for a differential amplifier circuit having a stabilized output common mode voltage over large common mode input ranges without loading the outputs of the amplifier for use in high speed applications.

SUMMARY OF THE INVENTION

In an embodiment, a circuit comprises: a differential amplifier including a differential input stage adapted to receive a differential input signal, said differential input stage having a pair of outputs, said outputs coupled to a pair of cascode transistors; a replica differential input stage adapted to sense a common mode input voltage of the differential input signal; and a bias generator circuit adapted to generate a bias voltage for application to the pair of cascode transistors which is dependent on the sensed common mode input voltage.

In another embodiment, a circuit comprises: a differential amplifier having a folded cascode architecture including a pair of cascode transistors; a sensing circuit adapted to sense a common mode input voltage of a differential input signal applied to the differential amplifier; and a bias generator circuit adapted to generate a bias voltage for application to the pair of cascode transistors in the folded cascode architecture, the generated bias voltage having a value which is dependent on the sensed common mode input voltage so as to stabilize a common mode output voltage from the differential amplifier in response to changes in the common mode input voltage.

In an embodiment, a method comprises: sensing a common mode input voltage of a differential input signal applied to inputs of a differential amplifier having a folded cascode architecture including a pair of cascode transistors; and generating a bias voltage for application to the pair of cascode transistors in the folded cascode architecture, the generated bias voltage having a value which is dependent on the sensed common mode input voltage so as to stabilize a common mode output voltage from the differential amplifier in response to changes in the common mode input voltage.

In another embodiment, a method comprises: receiving a differential input signal at a differential input stage of a differential amplifier, said differential amplifier having a pair of cascode transistors; sensing a common mode input voltage of the differential input signal; and generating a bias voltage for application to the pair of cascode transistors which is dependent on the sensed common mode input voltage.

In an embodiment, a circuit comprises: a differential input stage including a first input transistor configured to receive a first input signal, a second input transistor configured to receive a second input signal and a first tail current source coupled to supply a first current to the first and second input transistors at a first common connection node, said differential input stage having a pair of outputs; a pair of cascode transistors having conduction terminals respectively coupled to the pair of outputs of the differential input stage; a replica differential input stage including a third input transistor configured to receive said first input signal, a fourth input transistor configured to receive said second input signal and a second tail current source coupled to supply a second current to the third and fourth input transistors at a second common connection node, the third and fourth input transistors having a third common connection node configured to output a third current; and a bias generator circuit adapted to generate a bias voltage for application to control nodes of the pair of cascode transistors which is dependent on the third current.

In an embodiment, a circuit comprises: a differential input stage including a first input transistor configured to receive a first input signal, a second input transistor configured to receive a second input signal and a first tail current source coupled to supply a first current to the first and second input transistors at a first common connection node, said differential input stage having a pair of outputs; wherein the first and second input signals are differential signals having an input common mode voltage; a pair of cascode transistors having first conduction terminals respectively coupled to the pair of outputs of the differential input stage and having second conduction terminals configured to respectively generate first and second output signals; wherein the first and second output signals are differential signals having an output common mode voltage; a sensing circuit coupled to receive the first and second input signals, sense the common mode input voltage and generate a second current modulated as a function of the sensed common mode input voltage; and a bias generator circuit configured to generate a bias voltage as a function of the second current and apply said bias voltage to control terminals of the pair of cascode transistors.

In an embodiment, a method comprises: sensing common mode input voltage of a differential input signal; generating a first current modulated as a function of the sensed common mode input voltage; amplifying the differential input signal in a differential amplifier having a folded cascode architecture including a pair of cascode transistors to generate a differential output signal having a common mode output voltage; generating a bias voltage for application to the pair of cascode transistors in the folded cascode architecture; and modulating the bias voltage as a function of the first current.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
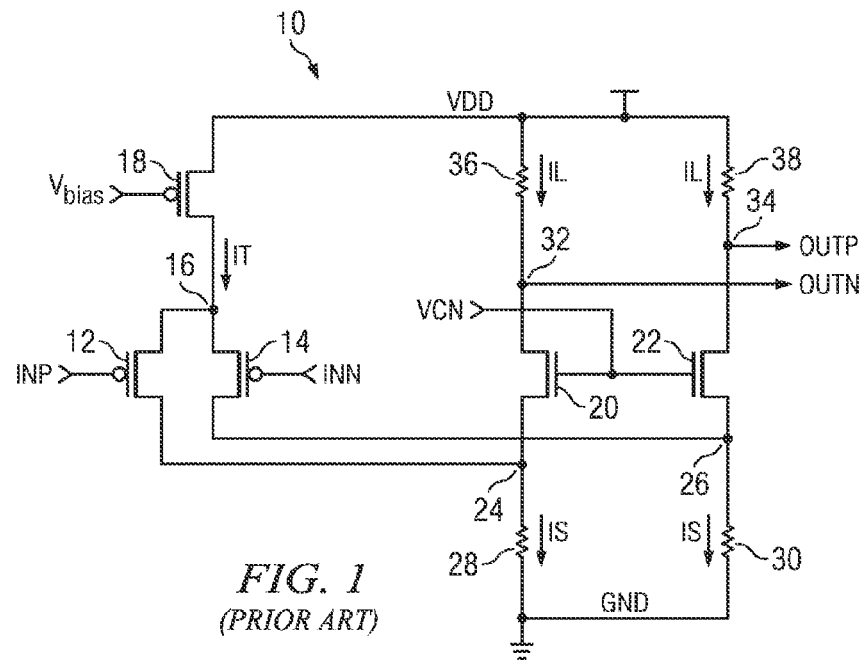
FIG. 1 is a schematic diagram of a prior art differential amplifier.
Figure 3:
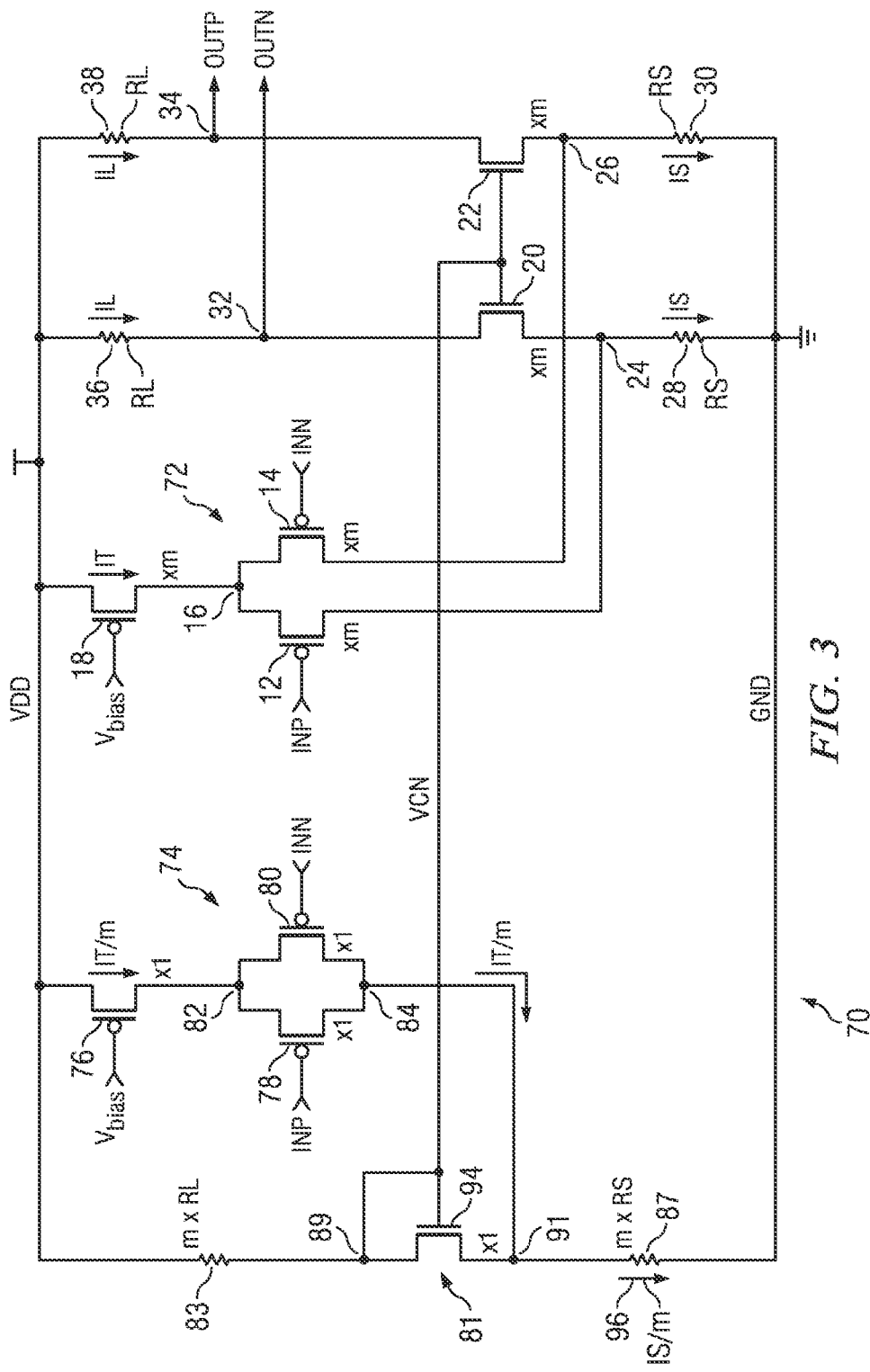
FIG. 3 is a schematic diagram of an embodiment of a differential amplifier.

Reference is now made to FIG. 3 which illustrates a schematic diagram of an embodiment of a differential amplifier 70. The amplifier 70 has a circuit configuration similar to that of amplifier 10 in FIG. 1. Thus, like reference numbers are used for like components and connections. The input stage 72 of the amplifier 70 includes transistors 12, 14 and 18, where transistors 12 and 14 have a corresponding pair of outputs (at their drains) coupled to the cascode transistors 20 and 22 at nodes 24 and 26. A replica input stage 74 is provided in amplifier 70 which includes replica transistors 76, 78 and 80 corresponding to transistors 18, 12 and 14, respectively. Transistor 76 is a replica PMOS tail current source transistor (corresponding to transistor 18), and transistors 78 and 80 are replica PMOS differential input transistors (corresponding to transistors 12 and 14). The gate of transistor 78 receives the input signal INP (like transistor 12) while the gate of transistor 80 receives the input signal INN (like transistor 14). The input signals INP and INN form the differential input signal. The sources of replica input transistors 78 and 80 are connected together at node 82 (corresponding to node 16). The drains of replica input transistors 78 and 80 are connected together at node 84. The replica tail current source transistor 78 is connected between the positive supply node (VDD) and node 82. The bias voltage Vbias is applied to the gate of transistor 76 (like transistor 18). The source of transistor 76 is coupled to receive supply voltage from the positive supply node (VDD).

The amplifier 70 is of the folded cascode type including the pair of NMOS transistors 20 and 22 (cascode devices) coupled to the differential input transistors 12 and 14 at nodes 24 and 26. The gates of transistors 20 and 22 are connected together and further receive a bias voltage VCN. The bias voltage VCN is provided by a bias generator circuit 81 comprising a fifth resistance (for example, a resistor) 83 coupled in series with NMOS transistor 94 and further coupled in series with a sixth resistance (for example, a resistor) 87. The gate of the NMOS transistor 94 is connected to its drain at node 89 (i.e., the transistor is diode-connected) with the bias voltage VCN being produced at that gate/node 89 for application to the gates of the pair of NMOS transistors 20 and 22. The bias generator circuit 81 is connected between the positive supply node (VDD) and the ground node (GND). The source of the NMOS transistor 94 at node 91 is connected to node 84 of the commonly connected drains of replica input transistors 78 and 80 for the replica input stage 74.

The input stage 72 of the amplifier 70 is scaled with respect to the replica input stage 74. The scaling is by a factor of m (where m≧1). Thus, transistor 18 is m times larger than replica PMOS tail current source transistor 76, and transistors 12 and 14 are m times larger than replica PMOS differential input transistors 78 and 80. Fifth resistance 83 of the bias generator circuit 81 is m times larger than third or fourth resistances 36 or 38 (i.e., m×RL), while sixth resistance 87 of the bias generator circuit 80 is m times larger than first or second resistances 28 or 30 (i.e., m×RS). Transistor 94 is sized consistent with the transistors of the replica input stage 74, while cascode transistors 20 and 22 are sized consistent with the transistors of the input stage 72, so that the transistors 20 and 22 are m times larger than the transistor 94.

Figure 4:
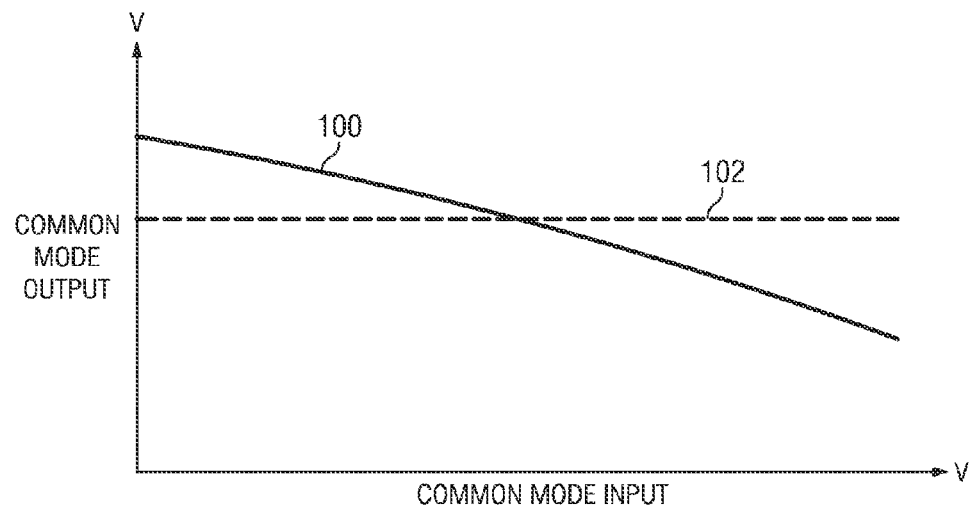
FIG. 4 graphically compares common mode input versus common mode output response for the circuits of FIGS. 1 and 3.

The replica input stage 74 functions to track the common mode input voltage (V(INP)+V(INN))/2. The current IT/m supplied by the replica tail transistor 76 is applied to the source node 91 of NMOS transistor 94 in the bias generator circuit 81. Changes in the common mode input voltage modulate the tail current IT/m due to limited output impedance of the transistors (especially in smaller geometries). The corresponding changes in the tail current IT/m change the current 96 flowing through resistance 87 so as to modulate the voltage at the source node 91 of NMOS transistor 94. The corresponding changes in the voltage at the source node 91 modulate the voltage at the gate and drain node 89 of NMOS transistor 94. This is the bias voltage VCN which is applied to the pair of NMOS transistors 20 and 22 and the modulation of the bias voltage VCN changes the current IS through resistances 28 and 30 proportionally to changes in the current IT. Thus, the modulations in the tail current IT/m (indicative of common mode input voltage) cause changes in the bias voltage VCN for the cascode transistors 20 and 22 effectively moving the common mode output voltage and counteract the effects of input common mode voltage change. The common mode voltage at the output (Vcm=VDD−(2*IS−IT)) thus will remain substantially constant (i.e., stabilized) in response to changes in the common mode input voltage as shown with line 102 in FIG. 4 which exhibits a very small slope (for example, in a simulation of the FIG. 3 circuit for a given process technology the small slope was positive with approximately a 1.6% change). A small slope for line 102, one preferably close to if not flat, would be considered stable.

Figure 2:
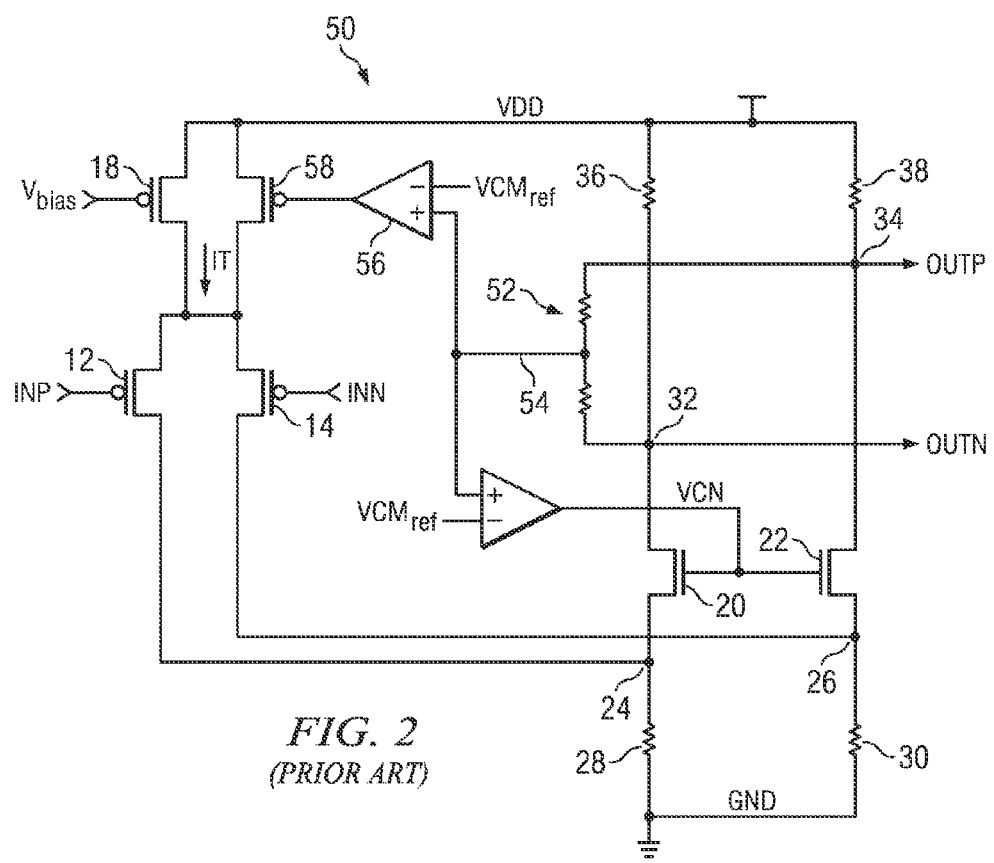
FIG. 2 is a schematic diagram of a prior art differential amplifier.

It will be noted that the circuit solution of FIG. 3 does not load the output nodes 32 and 34 (in the manner of FIG. 2), so the amplifier 70 is suitable for use in high speed applications. The bias voltage VCN tracks the common mode input voltage. There is no change in the load current IL and no change in common mode voltage at the output. Because the circuit tracks changes in the current IT, the circuit operates with improved common mode input rejection (CMIR) even up to the linear operating range of the tail current source transistor 18.

The circuit of FIG. 3 is illustrated with PMOS inputs. It will be understood that the circuit could alternatively be implemented using NMOS inputs (see FIG. 5).

It will be understood that the resistances 28, 30, 36, 38, 83 and 87 of FIG. 3 (and the corresponding resistances of FIG. 5) could alternatively be provided by MOS transistors in a constant current source configuration (instead of using resistors). Suitable biasing voltages (Vbias2 and Vbias3) would be applied to the MOS transistors. A different bias voltage (Vbias1) is applied to the tail current source transistor of the input stage.

Figure 5:
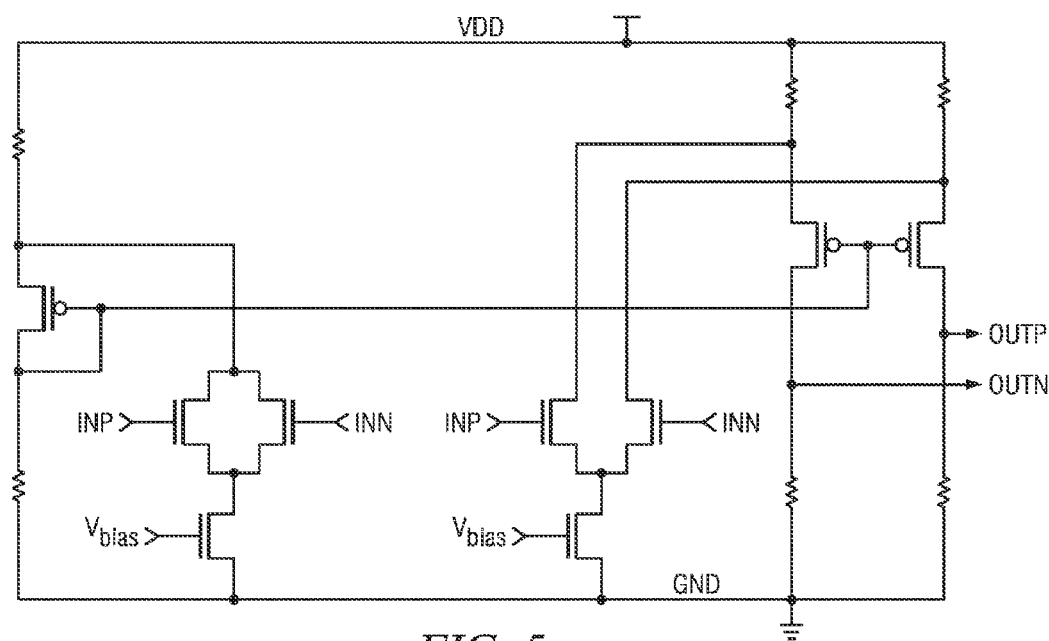
FIG. 5 is a schematic diagram of an alternative embodiment of a differential amplifier.

FIGS. 3 and 5 can be combined together in a manner well known to those skilled in the art to form an amplifier circuit with a combined PMOS and NMOS input stage supporting rail to rail common mode input range.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A circuit, comprising:
    a differential input stage including a first input transistor configured to receive a first input signal, a second input transistor configured to receive a second input signal and a first tail current source coupled to supply a first current to the first and second input transistors at a first common connection node, said differential input stage having a pair of outputs;
    a pair of cascode transistors having conduction terminals respectively coupled to the pair of outputs of the differential input stage;
    a replica differential input stage including a third input transistor configured to receive said first input signal, a fourth input transistor configured to receive said second input signal and a second tail current source coupled to supply a second current to the third and fourth input transistors at a second common connection node, the third and fourth input transistors having a third common connection node configured to output a third current; and
    a bias generator circuit adapted to generate a bias voltage for application to control nodes of the pair of cascode transistors which is dependent on the third current.

2. The circuit of claim 1, wherein the first and second input transistors are scaled m times larger than the third and fourth input transistors.

3. The circuit of claim 1, wherein the first current is m times larger than the second current.

4. The circuit of claim 1, wherein the first tail current source comprises a fifth transistor and the second tail current source comprises a sixth transistor, and wherein the fifth transistor is scaled m times larger than the sixth transistor.

5. The circuit of claim 1, wherein the bias generator circuit comprises a diode-connected transistor and the third current is applied to a source terminal of the diode-connected transistor and the bias voltage is supplied from the drain and gate nodes of the diode-connected transistor.

6. The circuit of claim 1, wherein the differential input stage is formed of PMOS transistors and the cascode transistors are formed of NMOS transistors.

7. The circuit of claim 1, wherein the differential input stage is formed of NMOS transistors and the cascode transistors are formed of PMOS transistors.

8. The circuit of claim 1, further comprising a first load resistance and a second load resistance respectively coupled between a reference voltage node and one of the cascode transistors, wherein the bias generator circuit comprises: a diode-connected transistor; and a third load resistance coupled between the reference voltage node and the diode-connected transistor, the third load resistance being scaled m times larger than either of the first and second load resistances.

9. The circuit of claim 8, wherein the third current is applied to a source terminal of the diode-connected transistor and the bias voltage is supplied from the drain and gate nodes of the diode-connected transistor.

10. The circuit of claim 1, wherein the first and second input signals are differential signals, and wherein the third and fourth input transistors modulate the third current as a function of a common mode of the differential first and second input signals.

11. The circuit of claim 10, wherein the bias voltage is modulated in response to the third current.

12. The circuit of claim 11, further including first and second output signals generated by the pair of cascade transistors, wherein the first and second output signals are differential signals, and wherein a common mode of the differential first and second output signals is stabilized by the modulated bias voltage.

13. A circuit, comprising:
a differential input stage including a first input transistor configured to receive a first input signal, a second input transistor configured to receive a second input signal and a first tail current source coupled to supply a first current to the first and second input transistors at a first common connection node, said differential input stage having a pair of outputs;
wherein the first and second input signals are differential signals having an input common mode voltage;
a pair of cascode transistors having first conduction terminals respectively coupled to the pair of outputs of the differential input stage and having second conduction terminals configured to respectively generate first and second output signals;
wherein the first and second output signals are differential signals having an output common mode voltage;
a sensing circuit coupled to receive the first and second input signals, sense the common mode input voltage and generate a second current modulated as a function of the sensed common mode input voltage; and
a bias generator circuit configured to generate a bias voltage as a function of the second current and apply said bias voltage to control terminals of the pair of cascode transistors.

14. The circuit of claim 13, wherein the sensing circuit comprises a replica differential circuit stage including a third input transistor configured to receive the first input signal, a fourth input transistor configured to receive the second input signal and a second tail current source coupled to supply a third current to the third and fourth input transistors at a second common connection node, the third and fourth input transistors further coupled at a third common connection node configured to generate the second current.

15. The circuit of claim 14 wherein first and second transistors of the differential input stage are scaled m times larger than the third and fourth transistors of the replica differential circuit.

16. The circuit of claim 13 wherein the bias generator circuit comprises a diode-connected transistor including a source node configured to receive the second current and a drain node configured to generate bias voltage.

17. The circuit of claim 14, wherein the third and fourth transistors modulate the second current as a function of the input common mode voltage.

18. The circuit of claim 17, wherein the bias voltage is modulated in response to the second current.

19. The circuit of claim 18, wherein the output common mode voltage is stabilized by the modulated bias voltage.

20. A method, comprising:
sensing common mode input voltage of a differential input signal;
generating a first current modulated as a function of the sensed common mode input voltage;
amplifying the differential input signal in a differential amplifier having a folded cascode architecture including a pair of cascode transistors to generate a differential output signal having a common mode output voltage;
generating a bias voltage for application to the pair of cascode transistors in the folded cascode architecture; and
modulating the bias voltage as a function of the first current.

* * * * *